United States Patent [19]

Winston

[11] Patent Number: 5,348,588
[45] Date of Patent: Sep. 20, 1994

[54] EVAPORATIVE TREATMENT OF INORGANIC SAPONIFIER WASH WATER

[75] Inventor: Anthony E. Winston, East Brunswick, N.J.

[73] Assignee: Church & Dwight Co., Inc., Princeton, N.J.

[21] Appl. No.: 129,430

[22] Filed: Sep. 30, 1993

Related U.S. Application Data

[63] Continuation-in-part of Ser. No. 85,005, Jun. 29, 1993, Continuation-in-part of Ser. No. 85,006, Jun. 29, 1993, Pat. No. 5,320,756.

[51] Int. Cl.$^5$ ............................ B08B 7/04; B01D 1/00
[52] U.S. Cl. ........................................ 134/10; 134/11; 203/47; 203/22; 159/24.2; 159/47.3
[58] Field of Search ................... 134/10, 11, 12, 42; 203/12, 14, 21, 22, 47; 159/24.2, 47.1, 47.3

[56] References Cited

U.S. PATENT DOCUMENTS

| | | | |
|---|---|---|---|
| 3,772,082 | 11/1973 | Dunn, Jr. | 134/10 |
| 3,899,348 | 8/1975 | Tedden | 134/12 |
| 3,979,220 | 9/1976 | Ishiyama et al. | 134/10 |
| 4,197,139 | 8/1980 | Hjersted | 134/12 |
| 4,244,506 | 1/1981 | Stokes, Jr. et al. | 228/223 |
| 4,468,257 | 8/1984 | Kaneko et al. | 134/22.13 |
| 4,676,908 | 6/1987 | Ciepiela et al. | 210/638 |
| 4,983,224 | 1/1991 | Mombrun et al. | 134/40 |

*Primary Examiner*—Paul Lieberman
*Assistant Examiner*—Lorna M. Douyon
*Attorney, Agent, or Firm*—Charles B. Barris

[57] ABSTRACT

The aqueous effluent from the wash cycle of a process for cleaning electronic circuit assemblies of rosin flux and other organic residues with an aqueous alkaline cleaning solution comprises evaporating the effluent to cause separation of an aqueous vapor phase and a solid phase comprising residues of the rosin flux and residues of the cleaning solution including alkaline salts such as alkali metal carbonates and bicarbonates and organic adjuvants such as surfactants which do not vaporize.

15 Claims, 1 Drawing Sheet

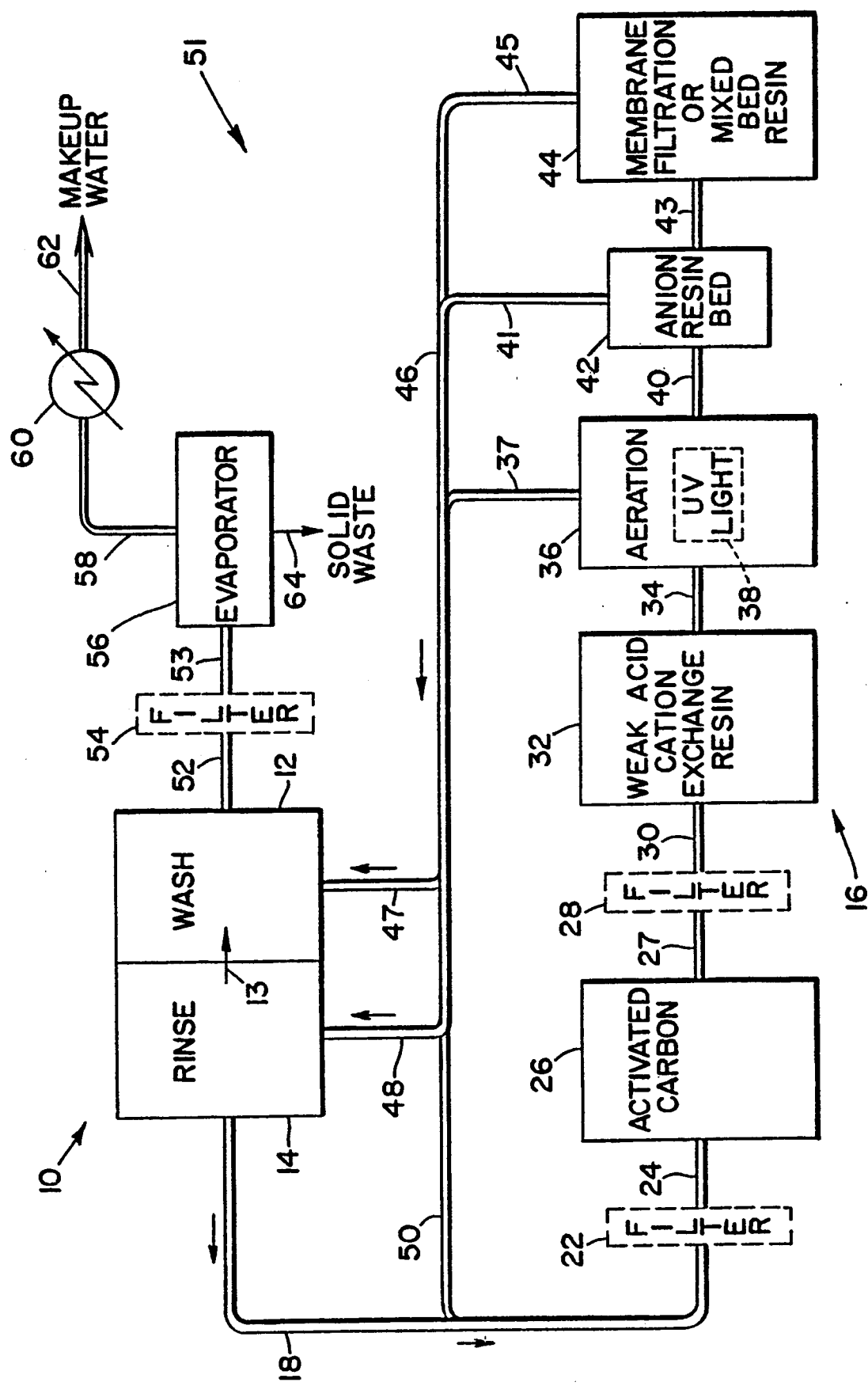

EVAPORATIVE TREATMENT OF INORGANIC SAPONIFIER WASH WATER

This application is a continuation-in-part application of U.S. Ser. Nos. 08/085,005 and 08/085,006, both filed Jun. 29, 1993, the latter now U.S. Pat. No. 5,320,756.

FIELD OF THE INVENTION

The present invention relates to a method of treating the effluents derived from aqueous wash and rinse solutions which have been used during the cleaning of electronic circuit assemblies. Thus, aqueous wash and rinse effluents which contain rosin flux residues, metals, alkaline salts and organic adjuvants to the cleaning solution and which are formed during cleaning electronic circuit assemblies are treated to remove the contaminants and saponifiers of the cleaning solution to yield a substantially organic-free and demineralized effluent which can be directly sewered or recycled.

BACKGROUND OF THE INVENTION

The cleanliness of electronic circuit assemblies (ECA), such as printed circuit boards (PCB) or printed wiring boards (PWB), is generally regarded as being critical to their functional reliability. Ionic and nonionic contamination on circuit assemblies is believed to contribute to premature failures of the circuit assemblies by allowing short circuits to develop.

In the manufacture of electronic circuit assemblies, ionic and nonionic contamination can accumulate after one or more steps of the process. Circuit assembly materials are plated, etched, handled by operators in assembly, coated with corrosive or potentially corrosive fluxes and finally soldered.

In the fabrication of electronic circuit assemblies, e.g., printed circuit boards, soldering fluxes are first applied to the substrate board material to ensure firm, uniform bonding of the solder. These soldering fluxes fall into two broad categories: rosin and non-rosin, or water soluble, fluxes. The rosin fluxes, which are generally only moderately corrosive and have a much longer history of use, are still widely used throughout the electronics industry The water soluble fixtures which are a more recent development, are being used increasingly in consumer products applications. Because water soluble fluxes contain strong acids and/or amine hydrohalides, such fluxes are very corrosive. Unfortunately, residues of any flux can cause circuit failure if residual traces of the material are not carefully removed following soldering and thus remain on an electronic circuit assembly.

While water soluble fluxes can be easily removed with warm, soapy water, the removal of rosin flux from printed circuit boards is more difficult and has therefore traditionally been carried out with the use of chlorinated hydrocarbon solvents such as 1,1,1,-trichlorethane, trichloroethylene, trichloromonofluoromethane, methylene chloride, trichlorotrifluoroethane (CFC113), tetrachlorodifluoroethane (CFC112) or mixtures or azeotropes of these and/or other solvents. These solvents are undesirable, however, because they are toxic and when released into the environment are believed to deplete the ozone layer. Thus, use of such solvents is subject to close scrutiny by the Occupational Safety and Health Administration (OSHA) and the Environmental Protection Agency (EPA) and stringent containment equipment must be used. Moreover, if released into the environment these solvents are not readily biodegradable and are thus hazardous for long periods of time.

Alkaline cleaning compounds known as the alkanolamines, usually in the form of monoethanolamine, have been used for rosin flux removal as an alternative to the toxic chlorinated hydrocarbon solvents. These high pH compounds (e.g., about 12 pH), chemically react with rosin flux to form a rosin soap through the process of saponification. Unfortunately, these compounds, as well as the water soluble soldering fluxes, have a tendency to cause corrosion on the surfaces and interfaces of printed wiring boards if such compounds and fluxes are not completely and rapidly removed during the fabrication process.

Other approaches have been used including a highly caustic solution having a pH of 13 in a batch cleaning process and use of terpene compounds in combination with terpene emulsifying surfactants.

The complete removal of adhesive and other residues also poses a problem. During the manufacture of electronic circuit assemblies the components are mounted on the upper surface of the board with leads protruding downwardly through holes in the board and are secured to the bottom surface of the board by means of an adhesive. Further, it is sometimes necessary to temporarily protect certain portions of the board from processing steps such as the process of creating corrosion resistant gold connecting tabs at the board edges. This transient protection of portions of the circuit board can be achieved by the application of special adhesive tape to susceptible areas. Once such protection is no longer needed, the adhesive tape must be removed. In both instances, a residue of adhesive generally remains which, if not thoroughly removed, can cause premature board failure. Removal of this adhesive residue has traditionally been carried out by the use of chlorinated solvents which, as already described, are toxic and environmentally undesirable.

Thus, the residual contaminants which are likely to be found on electronic circuit assemblies and which must be removed include, but are not limited to, for example, rosin flux, photoresist, solder masks, adhesives, machine oils, greases, silicones, lanolin, mold release, polyglycols and plasticizers.

Instead of the toxic chlorinated hydrocarbon solvents and the highly corrosive and highly basic amine cleaning solutions and the other organic solvent cleaning systems which pose problems to the environment, an alternative aqueous alkaline cleaning solution has been developed by the assignee to remove the rosin fluxes, adhesive residues and the like from electronic circuit assemblies. These compositions are set forth in patent application Nos. 896,381; 896,660; 896,409; 896,365; 896,379, all filed Jun. 10, 1992 now U.S. Pat. Nos. 5,234,505; 5,234,506; 5,261,967; 5,264,046 and 5,264,047, respectively, and 07/731,512, filed Jul. 17, 1991 now abandoned. These applications disclose aqueous alkaline cleaning solutions containing alkaline salts such as alkali metal carbonates and mixtures thereof with alkali metal bicarbonates and adjuvants such as alkali metal silicates to inhibit corrosion and brighten metal components, surfactants to aid in the cleaning efficacy of the cleaning solution, hydrotropes to maintain the surfactant in solution and stabilizers to maintain the alkali metal silicate in solution. These cleaning solutions have a pH ranging from about 10 to 13 and, in particular, are effective at solution pH's of less than 12 and are preferably utilized with an adequate reserve of titratable alkalinity to provide effective cleaning of the rosin fluxes and other adhesive residues and the like from the circuit assemblies.

For the removal of rosin soldering flux deposits, adhesives and the other residues during printed circuit/wiring board fabrication, the aqueous alkaline compositions are applied to the boards by immersion in dip tanks or by hand or mechanical brushing. Preferably, the cleaning solutions are applied by any of the commercially available printed wiring board cleaning equipment. Dishwasher size units may be employed, or much larger cleaning systems such as the "Poly-Clean+" and the various "Hydro-Station" models produced by Hollis Automation, Inc. of Nashua, N.H.

The temperature at which the flux removing compositions are applied typically range from room, or ambient, temperature (about 70° F.) to about 180° F., preferably about 140° to 170° F. The flux removing compositions or concentrates are diluted with water to from as low as about 0.1 percent by weight (or volume) concentration and up to about 15 percent by weight.

Once the solder flux has been loosened and removed during a period of contact which typically ranges from about 1 to about 5 minutes, but may be longer up to about 10 minutes, the boards are taken from the flux removing solution. An advantage of the aqueous alkaline cleaning solutions described previously and in the aforementioned copending, commonly assigned U.S. Applications is that these flux removing solutions need not be flushed from the boards with solvents as with the cleaners of the prior art. The boards are simply flushed with water for a period of up to about 2 minutes. Deionized water is preferred. The optimal rinsing time varies according to the kinds of surfactants and the concentrations of the flux removing solutions used and can easily be determined by routine experimentation.

The effluents from both the wash and rinse cycles from the cleaning process contain rosin flux residues, lead, tin and other materials removed from the electronic circuit assemblies as well as alkali metal carbonate, bicarbonate and silicate salts in addition to surfactants and other polymeric stabilizers used in the cleaning compositions. These effluents without treatment cannot be sewered and, further, cannot be recycled for use in the wash and rinse cycles. For example, in the disposal of industrial cleaning solutions, municipalities often mandate the levels of impurities which are allowable in sewage effluents. Thus, the regulations frequently mandate maximum permitted pH, maximum allowable heavy metals and maximum allowable organics measured as BOD or COD.

Accordingly, a treatment process is needed to remove the contaminants from the wash and rinse water effluents and preferably, provide sufficient removal of these materials such that the water can be directly sewered.

In copending, commonly assigned U.S. application Ser. No. 08/085,005, a multistage process for treating aqueous alkaline effluents containing rosin fluxes, carbonates, heavy metals and the like is disclosed. The treatment process includes carbon absorption to remove organic residues, ion exchange to remove metals and aeration to remove dissolved $CO_2$ formed from the carbonates during ion exchange. While the multistage process is an effective method for removing these contaminants from aqueous effluents, when the effluents are more highly concentrated in organic matter, carbonates, metal impurities and the like, passage of such effluents through carbon or ion exchange resin beds may soon overload such beds reducing the efficiency of contaminant removal and requiring substantial time and capital expense in regenerating the beds. Thus, in copending, commonly assigned U.S. application Ser. No. 08/085006, there is disclosed a one-step process for treating the aqueous wash effluent from the electronic circuit assembly cleaning process unlike the multi-step process described above and which yields an aqueous effluent which can be directly sewered. The one-step treatment of the aqueous wash effluent is achieved by adding an alkaline earth metal compound such as calcium chloride to the aqueous wash effluent. The calcium chloride reacts with the soluble carbonates, bicarbonates and silicates from the cleaning solution to precipitate the respective alkaline earth metal carbonates, bicarbonates and silicates which are insoluble in water. Additionally, the calcium chloride reacts with the anionic materials in the effluent including the rosin flux so as to form an alkaline earth metal salt of the rosin which is precipitated as the alkaline earth metal rosinate. Anionic organic materials such as surfactants and the heavy metals typically coordinated with the rosin flux are entrapped within the precipitated alkaline earth metal salts and are also removed from the aqueous effluent.

As an alternative for the one-step calcium chloride treatment, the application briefly suggests that evaporation of the aqueous phase of the effluent can be performed whereby the nonvolatile rosin fluxes, metals and heavier organic materials do not vaporize and are removed from the effluent. The present invention is an elaboration of this alternative effluent treatment process.

Both the multi-stage process and the evaporation process for treating aqueous effluents derived during cleaning of electronic circuit assemblies are particularly useful when the cleaning solution which has been used comprises the alkaline salt cleaners of the previously mentioned commonly assigned U.S. applications. The effluent treatment processes, however, are not as readily useful if a different type of aqueous cleaner is utilized, in particular, the conventional aqueous amine cleaner. Thus, while an aqueous effluent which contains an aqueous amine cleaner can be treated with carbon and ion exchange to effect removal of most organic contaminants washed from the circuit assemblies, solvents such as butoxy ethanol which is a component of the aqueous amine saponifiers is not removed by either the carbon treatment or ion exchange. Butoxy ethanol or other useful solvent which is left in the water will leave an unacceptable residue on the circuit boards being rinsed therein. Reverse osmosis could be used to clean up waste water containing the conventional saponifiers but such treatment is expensive, somewhat inefficient and still a significant amount of effluent is left over for ultimate disposal.

Similarly, treatment by evaporation of the aqueous phase and recondensation of the aqueous vapor is also not practical for treating electronic circuit assembly wash effluents containing the aqueous amine saponifiers since such solutions will contain volatile organic compounds such as the amines and ether solvents and the like which may be released into the atmosphere. Additionally, the aqueous amine wash baths have a short usage life and, therefore, the cost of evaporative treatment would be excessive.

SUMMARY OF THE INVENTION

In accordance with the present invention, the aqueous effluent derived from the wash cycle of a process for cleaning electronic circuit assemblies using an aqueous alkaline salt cleaning solution is treated by evaporation so as to form a volatile aqueous phase and a nonvolatile-phase comprised of residues of rosin flux, metals, and other residual contaminants washed from the electronic circuit assemblies and, as well, nonvolatile residues of the alkaline salts and organic adjuvants present in the cleaning solution. The aqueous vapor which is formed can be condensed and is essentially water which can be directly sewered or recycled such as for makeup water in the wash and/or rinse cycles of the cleaning process. Since no volatile organic compounds are present in the alkaline salt cleaners useful in the present invention, the problem of air pollution is avoided. The residues which remain comprise a small percentage of the aqueous effluent and can be easily disposed of as solid waste.

The treatment process for the wash effluent can be combined with a treatment process for the aqueous rinse effluent in which the rinse effluent is treated by the multi-stage process as set forth in copending, commonly assigned U.S. application Ser. No. 08/08505. Thus, in the combined process, the aqueous rinse effluent is treated with activated carbon and ion exchange as described in such copending application while the wash effluent is treated by evaporation and recondensation of the vapor phase to provide clean rinse or wash water. Since the alkaline salt cleaning solutions have a long usage life, the combined process is economically viable. Additional economies can be provided by capturing the heat during the condensation of the aqueous vapor phase and using the heat to heat the wash bath.

BRIEF DESCRIPTION OF THE DRAWING

The sole figure of the drawing is a schematic flow sheet of the process of the invention.

DETAILED DESCRIPTION OF THE INVENTION

The water treatment process of the present invention is particularly useful for treating effluents from the wash cycle of an electronic assembly cleaning process in which an aqueous alkaline cleaning solution is used to remove the flux and other contaminants from the assemblies and in which the cleaning solution preferably contains alkali metal carbonate and/or bicarbonate salts as the primary detersive agents. Especially preferred carbonates include potassium carbonate, potassium carbonate dihydrate, and potassium carbonate trihydrate, sodium carbonate, sodium carbonate decahydrate, sodium carbonate heptahydrate, sodium carbonate monohydrate, sodium sesquicarbonate and the double salts and mixtures thereof. The bicarbonate salts include potassium bicarbonate and sodium bicarbonate and mixtures thereof.

The cleaning solutions may also contain other suitable alkaline salts such as the alkali metal ortho or complex phosphates. The complex phosphates are especially effective because of their ability to chelate water hardness and heavy metal ions. The complex phosphates include, for example, sodium or potassium pyrophosphate, tripolyphosphate and hexametaphosphates. Additional suitable alkaline salts useful in the cleaning compositions include the alkali metal borates, acetates, citrates, tartrates, gluconates, succinates, silicates, phosphonates, nitrilotriacetates, edates, etc.

The alkaline salts are utilized in combination and in concentrations such that the resultant cleaning solutions have a pH of from about 10, or somewhat less, to 13, preferably from about 10 to less than 12 and, more preferably from 10.5 to 10.9. The desired pH of the cleaning solution may depend on the type of flux being removed. Thus, the lower pH range is desirable and effective for removing the more easily removed fluxes. However, a pH of above 11.5 is preferred when removing the more difficult to remove solder paste fluxes. It is also most desirable that the alkaline salts utilized in combination at the dilution of the wash bath and at the desired pH also have an adequate reserve of titratable alkalinity, at least equivalent to from about 0.2 to 4.5 percent, preferably, 0.6 to 4.5 percent caustic potash (potassium hydroxide), when titrated to the colorless phenolphthalein end point, which is at about pH 8.4 to maintain enhanced performance. The useful cleaning solutions, therefore, have relatively high concentrations of alkaline salts and high pH and cannot be sewered without treatment especially when containing the contaminants from the ECA.

The preferred flux removing compositions also typically contain one or more corrosion inhibitors to prevent corrosion or pitting of the connecting tabs or solder joints, metals or other materials present on the circuit boards being cleaned. The corrosion inhibitor is an alkali metal silicate salt with the sodium and potassium silicate salts being most preferred. While the ratio of the two oxides can vary, most useful alkali metal silicates will have an $M_2O$ to $SiO_2$ mole ratio of between 1:0.5 to 1:4.5 wherein M represents the alkali metal. The silicates also provide additional alkalinity to the wash water to help cleaning. The addition of silicate actually promotes the brightness and shininess of the solder joints. For sufficient corrosion protection, it is useful to add 0.1 to 20 wt.% of the silicate corrosion inhibitor based on the amount of cleaning composition (without water).

At pH below 13 and, in particular, below 12, it has been found that the silicate precipitates from aqueous solutions. The silicates are stabilized and kept in aqueous solution by the addition of an anionic polymer to the composition. Particularly preferred are anionic polymers containing carboxylate groups.

In general, anionic homopolymers or copolymers with molecular weights between about 1,000 to about 5,000,000 or mixtures thereof are usefully employed as silicate stabilizers. The following anionic polymers are non-inclusive examples of those suitable for stabilizing silicate solutions: carboxymethylcellulose, polyacrylic acid, polymethacrylic acid, polymaleic acid, polyglycolic acid, heteropolymers of acrylic and methacrylic acid, xanthan gum, carrageenan gum and alginate gum. In the alkaline cleaning solutions, the anionic polymers are essentially present in the form of the sodium or potassium salts thereof. The high molecular weight, e.g., above 150,000, polyacrylic acids are especially preferred.

The cleaning compositions also typically include antifoam agents and surfactants to enhance detersive efficacy and hydrotropes to aid in maintaining the solubilization of the organic adjuvants. A preferred hydrotrope includes the alkali metal salts of intermediate chain length monocarboxylic fatty acids, i.e., $C_1$–$C_{13}$.

Washed off of the electronic circuit assemblies and carried into the wash and rinse water during the cleaning process are primarily the rosin fluxes, solder, as well as any residues of adhesive which remain on the assemblies. Also, removed are photoresist, solder mask, machine oils, greases, silicones, lanolin, mold release agents, polyglycols and plasticizers, etc. The aqueous wash and rinse effluents also contain the alkaline salts and organic agents as described above. To sewer the aqueous phase of the wash effluent from the electronic circuit assembly cleaning process, it is necessary to remove not only the contaminants which are cleaned from the electronic circuit assemblies but, the components of the cleaning composition as well. Moreover, governmental mandates require that aqueous effluents which are sewered must have a minimum level of cleanliness as exemplified by standards for pH, metal content and BOD and/or COD levels. A typical wash water effluent from an ECA cleaning process is characterized in Table 1. A typical rinse effluent is characterized in Table 2.

TABLE 1

Constituents of Wash Effluent

| | Typical | Range |
|---|---|---|
| pH | 10.5 | 10.0–12.0 |
| Specific gravity | 1.05 | 0.95–1.1 |
| Non-volatile solids | 2.2% | 0.2–10.0% |
| Hardness | 0 ppm | 0.0–10 ppm |
| Lead | 1 ppm | 0.1–10 ppm |
| Other heavy metals | 10 ppm | 0.2–25 ppm |
| Alkalinity as $CaCO_3$ | 22,000 ppm | 2,000–100,000 ppm |
| COD | 10,000 ppm | 2,000–20,000 ppm |
| Potassium | 6,000 ppm | 0.0–50,000 ppm |
| Sodium | 4,000 ppm | 0.0–50,000 ppm |
| Chloride | 100 ppm | 0.0–1,000 ppm |
| Silica | 400 ppm | 0.0–5,000 ppm |

TABLE 2

Constituents of Rinse Effluent

| | Typical | Range |
|---|---|---|
| pH | 10.0 | 8.0–11.0 |
| Specific gravity | 1.00 | 0.98–1.02 |
| Non-volatile solids | 0.02 | 0.001–0.05% |
| Hardness | 0 ppm | 0.0–1 ppm |
| Lead | <0.1 ppm | 0.0–1 ppm |
| Other heavy metals | 10 ppm | 0.2–25 ppm |
| Alkalinity as $CaCO_3$ | 200 ppm | 50–500 ppm |
| COD | 100 ppm | 20–200 ppm |
| Potassium | 60 ppm | 10–200 ppm |
| Sodium | 40 ppm | 10–200 ppm |
| Chloride | 10 ppm | 0.1–20 ppm |
| Silica | 4 ppm | 0.0–50 ppm |

The treatment of the wash and rinse water effluents from the electronic circuit assembly cleaning process for recycle thereto can best be understood by referring to the Figure. As shown therein, the electronic circuit assembly cleaning process is depicted by reference numeral 10 and includes a wash cycle 12 and a rinse cycle 14. In the wash cycle, the alkaline cleaning composition as described above and in the aforementioned copending, commonly assigned U.S. applications is used to clean the rosin flux and other residues from the electronic circuit assemblies. Upon completion of the wash cycle 12, the circuit assemblies are then passed to the rinse cycle 14 wherein fresh water is placed in contact with the cleaned electronic circuit assemblies to wash any further residues of the cleaning composition from the substrates. Used water from the rinse cycle 14 can be added as makeup water for the wash cycle 12 as shown by arrow 13.

The water effluent from wash cycle 12 is directed to treatment process 51 of the present invention which includes an evaporation stage 56 to separate the effluent into an aqueous volatile phase and a solid residue. Process 51 will be described below. The water effluent from the rinse cycle 14 can be directed to the treatment process indicated by reference numeral 16 by way of line 18. Process 16 is as described in U.S. application Ser. No. 08/085006. As disclosed therein, aqueous effluent from rinse cycle 14 which is not used as makeup for the wash water in wash cycle 12 bypasses wash cycle 12 and is directly charged to line 18. The treatment process 16 is most applicable to the aqueous rinse effluent inasmuch as the aqueous effluent from the wash cycle 12 will be heavily concentrated with rosin fluxes, metals and other contaminants which may quickly overload the activated carbon and ion exchange resin beds of the treatment process.

The process for treating the effluent from the rinse cycle 14 begins by directing the effluent from line 18 to an initial filtration stage 22 to remove solder and other residual particulates suspended in the effluent. Filter 22 may take any desired form such as a dual-media filter containing granular anthracite coal placed over sand. Filtration may be affected at any desired filtration rate effective to remove the suspended solids. Filter 22 is desirably a relatively course filter having the ability to remove relatively large particles of 10 microns and above. Filtering stage 22 is optional and can be eliminated if the presence of solids in the effluent is not indicated.

The effluent from filter 22 free from coarse suspended solids passes through line 24 to an activated carbon absorption bed 26 to effect removal of the organic constituents from the aqueous rinse effluent. Thus, the activated carbon bed 26 removes many of the rosin flux residues and metals complexed thereto and adhesive residues and the like washed from the ECA as well as the organic adjuvants which were contained in the cleaning compositions including antifoam agent, surfactants and any polymeric stabilizers used to maintain the ingredients of the cleaning composition in solution. These stabilizers include the anionic polymer stabilizer used to maintain any silicate anticorrosion agent in solution and any hydrotrope used to maintain surfactants and antifoam agents in solution. The activated carbon absorption bed 26 may take any convenient form. As the water effluent passes through a bed or a series of beds of the granular activated carbon, the organic material is absorbed from the aqueous effluent by the carbon particles. The limiting design criteria is the residence contact time required to meet the effluent discharge requirement. The pore sites of the carbon bed are continually filled as the water effluent passes through the bed and eventually effluent concentrations approach unacceptable levels. The carbon then is replaced with fresh material or regenerated, for example, in a furnace. Back-washing of the activated carbon particles may be effected from time to time using recycled treated water.

The aqueous effluent leaving the activated carbon bed 26 and free from organic material can be optionally directed via line 27 to a filtering unit 28 provided to remove very fine particulates of at most 1 micron and which may include suspended minute carbon particles as well as emulsified rosin and polymeric residues which are not absorbed onto the carbon. The essentially organic-free effluent from either filter 28 or directly from carbon bed 26 is passed via line 30 into cation exchange resin bed 32 for removal of metal values and dissolved cationic species which are contained within the aqueous effluent. The metal values typically include lead and tin soldering residues and other heavy metal residues washed from the electronic circuit assemblies and not complexed and removed with the flux in carbon bed 26. As well, alkali metal cations, typically potassium and sodium ions which form the alkaline cleaning salts will be contained in both the wash and rinse effluents. The cation exchange resin is used in the hydrogen form and is preferably of the weak acid type. Weak acid types, for example, include polyacrylic and polymethacrylic acid resins which have been crosslinked with styrene-divinylbenzene. The cation-exchange resin may also be of the strong acid type, which is generally a sulfonated copolymer of styrene and divinyl benzene if higher levels of metal ionic species are present in the effluents. The cation exchange resin is readily available in commerce. The particular resin to be used can be chosen relative to the specific characteristics of the effluent and requirements of the recycled water.

As the metal cations are removed from the effluent and replace the hydrogen cations on the resin, the pH of the aqueous effluent is favorably lowered by addition of $H^+$ ions exchanged off the resin. At the same time, the hydrogen ions exchanged off the resin replace the potassium and sodium ions in the effluent. The cationic exchange converts the carbonates and bicarbonates to $CO_2$ which is dissolved in the aqueous effluent. The conversion can be depicted by the following reactions:

$2H^+ + CO_3^{-2}$ (carbonate) $= H_2O + CO_2$

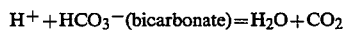

$H^+ + HCO_3^-$ (bicarbonate) $= H_2O + CO_2$

The dissolved carbon dioxide is removed from the de-metalized aqueous effluent leaving the cation exchange resin bed 32 by passing the effluent via line 34 to aeration tank 36 in which aeration is effected by bubbling air through the effluent in any convenient manner. The air bubbles passing through the effluent strip and carry the dissolved carbon dioxide therefrom. During aeration, it may be possible to simultaneously expose the effluent to UV light as indicated by reference numeral 38 to kill any microorganisms such as bacteria or algae.

The aqueous effluent which is now free from rosin flux residues, metallic species which have been washed from the electronic circuit assemblies and, as well, alkaline salts and organic matter either washed off the board or present as a component in the cleaning solution can now be directly sewered inasmuch as the BOD and COD content of the effluent has been greatly reduced and the pH of the effluent has been sufficiently reduced to below 10 as not to pose a safety or environmental hazard or recycled. Preferably, the treated effluent is recycled to either the wash or rinse cycles or both as makeup water for these two cycles in the cleaning process.

However, certain contaminant species may still be present in the aqueous effluent leaving the aeration zone 38 via line 40. For example, various anions such as silicate ions may still be present in the effluent. In order to insure complete demineralization of the aqueous effluent, the treated effluent can be directed from aeration tank 36 via line 40 to a anion exchange resin bed 42. Since aeration in tank 36 readily removes most of the anionic species such as the carbonate and bicarbonate anions, large amounts of anionic exchange resin are not required, thus, minimizing the expense of using the costly resin. The anion exchange resin used is in the hydroxide form and typically can comprise styrene-divinyl benzene copolymers quaternized with trimethylamine after chloromethylation with chloromethyl methylether or obtained by the reaction of the styrene-divinyl benzene copolymer with diethanoi amine. Both of these products are well known and commercially available.

The anion exchange resin bed 42 for removal of ions can be replaced or even augmented by membrane filtration or treatment in a mixed resin bed. Thus, subsequent to anion exchange in bed 42 the effluent can be directed to unit 44 via line 43 for membrane filtration or for ion exchange in a mixed resin bed. Unit 44 may also replace anion exchange resin bed 42 entirely. For membrane filtration, unit 44 which can remove any ion by reverse osmosis using semipermeable membranes as is well known to effect demineralization of the waste water effluent. If used as a mixed bed, unit 44 contains a bed of cation exchange resin mixed with minimal amounts of the more costly anion exchange resin. The cation exchange resins have been described above and typically comprise the acid forms of sulfonated styrene-divinyl benzene copolymer or weak cation exchange resin polyacrylic acid. The anion exchange resin can also be as described above.

The purified and demineralized aqueous effluent resulting from either the aeration stage 36, anion exchange resin bed 42 or reverse osmosis (mixed bed) unit 44 can now be recycled to the cleaning process 10. Thus, the treated aqueous effluent can be directed from the last stage of the treatment process via lines 37, 41 or 45 to line 46 and subsequently to the wash cycle via line 47 and/or via line 48 to the rinse cycle. If the treated effluents do not meet requirements for make-up water, the treated effluents can be recycled to treatment process 16 via line 50. Although not shown, it is possible to pass the treated effluent to a storage tank which would enable a continuous flow of treated aqueous effluent for recycle even through any periodic cleaning or regeneration of the carbon or ion exchange resin beds as may be required.

The treatment process 16 has particular use in treating the aqueous effluent from the rinse cycle since as previously stated, the wash water effluent will have highly concentrated levels of rosin fluxes, organics, metals and alkaline salts which may rapidly overload the absorption and ion exchange resin beds of this process. Thus, in accordance with the present invention, the wash water effluent is treated separately. In general, treatment of the wash water effluent comprises evaporation to form an aqueous vapor phase and a residual solid phase and subsequent condensation of the aqueous phase. The evaporation technique is particularly effective since there are no organic volatiles present in the aqueous wash effluent either washed off the electronic circuit assemblies or originally present in the useful aqueous alkaline cleaning solutions as described above. Any organic material contained in the effluent has a relatively large molecular weight and will not volatilize during evaporation. The aqueous vapor phase formed during evaporation and subsequently condensed can be recycled to the wash and/or rinse cycles.

The treatment of the aqueous effluent from wash cycle 12 in process 51 can now be described referring to the Figure. Thus, the aqueous effluent from wash cycle 12 is passed via line 52 to an initial filtration stage 54 to remove solder and other residual particulates which may be suspended in the effluent. Filter 54 may take any desired form such as a dual-media filter containing granular anthracite coal placed over sand equivalent to filter 22. Filtration may be effected at any desired filtration rate effective to remove the suspended solids. Filter 54 is desirably a relatively coarse filter having the ability to remove relatively large particles of 10 microns and above. Filtering stage 54 is optional and can be eliminated if the presence of solids in the effluent is not indicated. Moreover, since the subsequent evaporation stage would most likely be unaffected by the presence of solids, such filtering stage can also be eliminated even if residual solids are present.

Therefore, the aqueous effluent from wash cycle 12 can be directly passed to evaporator 56 or the effluent from filter 54 can be passed to evaporator 56 via line 53 to effect removal of the contaminants from the water. Evaporator 56 at its simplest may comprise an open vessel to which heat is applied, whereby the water boils off leaving the solid residue behind. In this case, the purified water is not collected. The solid residue which remains includes the rosin fluxes, metals and organic materials washed from the circuit assemblies as well as residues of the alkaline salts and organic adjuvants which were contained in the cleaning solution. Typically, these residues comprise from about 1–5% of the aqueous wash effluent. This residue can be removed as a solid waste via line 64 and disposed of.

Preferably, the water which evaporated is recovered and condensed and recycled to the process to reduce fresh water needs. Thus, evaporator 56 may comprise a more sophisticated apparatus wherein the vaporized aqueous phase which is formed passes through line 58 and is condensed in condenser 60 and passed via line 62 as make-up water either to the wash or rinse cycles or both. Any known system can be used for such purpose. A particular system which is known is referred to as the Alcoa Thermopure System which is described in U.S. Pat. No. 3,843,463, issued Oct. 22, 1974, and incorporated herein by reference. The evaporation stage 56 can include a single evaporator or the evaporation may take place in stages in which incremental amounts of water are removed in each of the stages to form a slurry and the slurry eventually dried in the final stage to form the dry solid waste. The water evaporated in each of the respective stages can be condensed and recycled. An important feature of the evaporation stage is that when used with the alkaline salt cleaning compositions described previously, there are no low molecular weight organic materials which are volatilized with the water. Thus, there is no volatile organic compounds which can pass into the atmosphere and adversely affect the environment. Further, the evaporation stage is a simple method of removing contaminants from the wash effluent which are heavily concentrated with the flux residues, metals and cleaning salts and organic adjuvants of the cleaning solution. This heavy concentration of contaminants would quickly inactivate the carbon bed and ion exchange resin of the rinse effluent treatment. Thus, by dividing the treatment of the wash and rinse effluents, a high purity make-up water stream can be provided without creating a large volume waste stream.

By recovering the water phase from the evaporator by condensing this stream in condenser 60, additional economies can be added to the effluent treatment process. Thus, the heat which is captured from condensing the aqueous vapor can be used to provide heat to the cleaning process 10. Although this feature is not shown in the Figure, any particular fluid can be used to capture the heat from the condensing aqueous phase in condenser 60 and transferred by heat exchange with the wash or rinse baths.

EXAMPLE

In this example, the wash and rinse effluents are treated separately as depicted in the Figure. Thus, a typical rinse effluent such as described in Table 1 above is treated by process 16 as depicted in the Figure including the optional processing in both the coarse and fine filters and the anion exchange resin bed. UV light treatment, mixed bed treatment and membrane filtration are not utilized. The aeration is achieved in a 60 gallon aeration tank. Flow rate through the process is maintained generally at about 1 gallon per minute. Accordingly, residence time in the aeration tank is about 1 hour. The rinse water effluent subsequent to treatment has the constituent level as set forth in Table 3.

TABLE 3

| | |
|---|---|
| pH | 5.7–7.1 |
| Specific gravity | 0.98–1.02 |
| Non-volatile solids | 0.00% |
| Hardness | <0.1 ppm |
| Lead | <0.02 ppm |
| Other heavy metals | <0.02 ppm |
| Alkalinity as $CaCO_3$ | <0.1 ppm |
| COD | <1 ppm |
| Potassium | <0.1 ppm |
| Sodium | <0.1 ppm |
| Chloride | <0.1 ppm |
| Silica | <0.1 ppm |

The wash solution which has been used for one week in the wash bath and contains approximately 1.5% sodium and potassium carbonates, bicarbonates and other inorganic salts, surfactants and polycarboxylated polymer, as well as, dissolved and emulsified flux and soil residues removed from the circuit boards is passed through a coarse filter and the filtrate directed to an evaporator. Prior to entering the evaporator, the filtrate is heated to a temperature of 90° C. The evaporator is a vacuum tank in which a vacuum of 2 inches mercury is maintained. The filtrate is passed through spray nozzles at the top of the evaporator at a rate of approximately 1 gallon per minute and sprayed into the volume space of the tank. Water vapor is removed through the top of the tank by vacuum while a solid residue settles at the bottom of the tank. The aqueous vapor which is removed is condensed in a heat exchange unit using cold water as the heat transfer fluid. The condensed effluent has a pH of about 8.3, an organic content of 50 ppm as BOD and a lead, tin and other heavy metal content of less than 0.1 ppm. The aqueous effluent from the condenser and the treated aqueous rinse effluent can be combined and used as make-up water for the wash bath.

What is claimed is:

1. A process for treating an aqueous cleaning effluent derived from the wash cycle of a process for cleaning electronic circuit assemblies with an aqueous alkaline cleaning solution having a pH from about 10 to about 13 and containing rosin flux residues, and inorganic alkaline salt residues and substantially no volatile organic compounds comprises: evaporating said effluent to form an aqueous vapor phase and a solid residue comprising said rosin flux and said inorganic alkaline salt.

2. The process of claim 1 further comprising condensing said aqueous vapor phase.

3. The process of claim 1 wherein said aqueous cleaning effluent is an effluent from the wash cycle of a process for cleaning electronic circuit assemblies with an aqueous alkaline cleaning solution.

4. The process of claim 1 wherein said inorganic alkaline salt residues are part of said cleaning solution and comprise alkali metal carbonates, alkali metal bicarbonates or both.

5. The process of claim 1 wherein said aqueous cleaning effluent further contains alkali metal silicates originally present in said alkaline cleaning solution.

6. The process of claim 1 wherein said aqueous cleaning effluent further contains non-volatile organic ajuvants originally present in said cleaning solution, said organic adjuvants being separated from said effluent as part of said solid residue.

7. The process of claim 1 wherein the process for cleaning said electronic circuit assemblies further includes a rinse cycle in which said cleaned assemblies are rinsed with water to form a rinse effluent, said effluent from said wash cycle being subjected to said evaporation and said effluent from said rinse cycle bypassing said evaporation.

8. The process of claim 7 wherein said effluent from said rinse cycle contains said rosin flux residues and metal ions washed from said electronic circuit assemblies and alkali metal salts and organic adjuvants from said cleaning solution and wherein said effluent from said rinse cycle is passed through an activated carbon bed to effect removal of said rosin flux residues and organic adjuvants to form a substantially organic-free effluent and wherein said substantially organic-free effluent is passed through an ion exchange resin bed to remove said metal ions and alkali metal cations from said alkali metal salts.

9. The process of claim 8 further comprising condensing said aqueous vapor phase and combining the said aqueous condensate with the rinse cycle effluent subsequent to treatment in said ion exchange resin bed and recycling the combined effluent to said wash cycle, rinse cycle or both.

10. The process of claim 9 wherein heat removed from said aqueous vapor phase during said condensing is captured and directed to heat said alkaline cleaning solution.

11. The process of claim 4 wherein said aqueous cleaning effluent further contains alkali metal silicates originally present in said alkaline cleaning solution.

12. The process as claim 4 wherein said aqueous cleaning effluent further contains non-volatile organic adjuvants originally present in said cleaning solution, said organic adjuvants being separated from said effluent as part of said solid residue.

13. The process of claim 11 wherein said aqueous cleaning effluent further contains non-volatile organic adjuvants originally present in said cleaning solution, said organic adjuvants being separated from said effluent as part of said solid residue.

14. The process of claim 6 wherein said organic adjuvants are selected from the group consisting of surfactants, anti-foam agents, carboxylated polymers or mixtures thereof.

15. The process of claim 13 wherein said organic adjuvants are selected from the group consisting of surfactants, anti-foam agents, carboxylated polymers or mixtures thereof.

* * * * *